(12) United States Patent
Park

(10) Patent No.: US 6,944,086 B2
(45) Date of Patent: Sep. 13, 2005

(54) SEMICONDUCTOR MEMORY DEVICE

(75) Inventor: Byung-Il Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/788,704

(22) Filed: Feb. 27, 2004

(65) Prior Publication Data

US 2005/0135158 A1 Jun. 23, 2005

(30) Foreign Application Priority Data

Dec. 22, 2003 (KR) .................................. 10-2003-0094697

(51) Int. Cl.[7] .............................................. G11C 8/00
(52) U.S. Cl. .................. 365/230.03; 365/198; 365/225
(58) Field of Search ........................... 365/230.03, 198, 365/207, 225

(56) References Cited

U.S. PATENT DOCUMENTS 6,643,787 B1 * 11/2003 Zerbe et al. ................. 713/400
6,681,353 B1 * 1/2004 Barrow ........................ 714/725

* cited by examiner

*Primary Examiner*—Gene N. Auduong
(74) *Attorney, Agent, or Firm*—Blakely Sokoloff Taylor & Zafman

(57) ABSTRACT

A semiconductor memory device having a bank for storing a data and a port as a data I/O terminal includes a transmitter for delivering the data inputted from the port; a global data bus for flowing an appearing current corresponding to the data outputted from the transmitter; and a receiver for sensing the appearing current by using a current-mirror and delivering the data corresponding to the sensed appearing current into the bank, wherein a swing range of a data bus voltage in response to the appearing current is narrower than a gap between a supply voltage and a ground.

10 Claims, 3 Drawing Sheets

SEMICONDUCTOR MEMORY DEVICE

FIELD OF INVENTION

The present invention relates to a semiconductor memory device; and, more particularly, to an apparatus and a method for retrieving a data stored in a bank of the semiconductor memory device.

DESCRIPTION OF PRIOR ART

Generally, a bus is defined as a data path among some functional blocks inside a system or a device. Likewise, a semiconductor memory device has two kinds of bus, i.e. a local data bus and a global data bus. The local data bus is used inside a core area, e.g. a bank, but the global data bus serves as a path for delivering a data inputted from a data I/O port into the core area or delivering a data outputted from the core area into the data I/O port.

FIG. 1 is a block diagram showing a data path of a conventional semiconductor memory device.

As shown, the conventional semiconductor memory device includes a port 14, a bank 16, a global data bus GIO, a first transceiver 10 and a second transceiver 20. The global data bus GIO is located between the port 14 and the bank 16. The first transceiver 10 is coupled between the port 14 and the global data bus GIO, and the other is coupled between the bank 16 and the global data bus GIO.

Each transceiver, e.g. 10 and 20, has a transmitter and a receiver. Namely, the first transceiver 10 includes a first transmitter QTx for loading an inputted data from the port 14 into the global data bus GIO and a first receiver QRx for delivering a loaded data of the global data bus GIO to the port 14. In addition, the second transceiver 20 includes a second transmitter Tx for loading an output data from the bank 16 into the global data bus GIO and a second receiver Rx for delivering a loaded data of the global data bus GIO to the bank 16.

FIG. 2 is a schematic diagram describing the second transmitter Tx and the first receiver QRx shown in FIG. 1.

As shown, the second transmitter 22 (Tx) includes two MOS transistor. One MP is a pull-up PMOS transistor having a gate, a drain and a source: wherein the gate receives a first output data signal aaa from the bank 16; the drain is supplied with a core voltage source VCC; and the source is coupled to the global data bus GIO. The other MN is a pull-down NMOS transistor having a gate, a drain and a source: wherein the gate receives a second output data signal bbb from the bank 16; the drain is supplied with the ground VSS; and the source is coupled to the global data bus GIO and the source of the pull-up PMOS transistor MP. Moreover, the first receiver 14 (QRx) is constituted with one CMOS inverter INV.

Furthermore, in a view of the structure, the first transmitter QTx is same to the second transmitter 22 and the second receiver Rx is same to the first receiver 14.

If the first and second data signals aaa and bbb are a logic low level, the pull-up transistor MP of the second transmitter 22 is turned on. Then, the global data bus GIO is supplied with a logic high level. Next, the first receiver 14 inverts a logic high level voltage of the global data bus GIO to output the inverse signal, i.e. the a logic low level voltage, as the data signal ccc.

In the contrast, if the first and second data signals aaa and bbb are a logic high level, the pull-down transistor MN of the second transmitter 22 is turned on. Then, the global data bus GIO is supplied with a logic low level level. Next, the first receiver 14 inverts the a logic low level voltage of the global data bus GIO to output the inverse signal, i.e. a logic high level voltage, as the data signal ccc.

Herein, if the first data signal aaa is a logic low level and the second data signal bbb is a logic high level, the output terminal of the second transmitter 22 is a high impedance (Hi-Z). But, when the first data signal aaa is a logic high level and the second data signal bbb is a logic low level, the second transmitter 22 is disabled.

As described above, the described operation is applied to the first transmitter QTx of the first transceiver 10 and the second receiver Rx of the second transceiver 20.

Typically, for increasing a band width, the global data bus includes a plurality of bus lines. For example, in a double data rate II dynamic random access memory (hereinafter, referred as a DDR2 DRAM) which has the widest band with of the semiconductor memory device, the global data bus includes 64 number of bus lines.

In the case that the number of bus lines included in the global bus line is equal to or under 64, a current consumption is not a critical issue though a voltage level of a data passing through the global bus line is varied from the ground to the core voltage source VCC, i.e. a swing range of the data is wide. Namely, the current consumption is not seriously large.

However, if the number of bus lines included in the global bus line is above 64, e.g. the number of bus lines is 128, 256 or 512, the current consumption is rapidly increased because the swing range of the data is wide.

SUMMARY OF INVENTION

It is, therefore, an object of the present invention to provide a semiconductor memory device for minimizing a current consumption according to increasing the number of bus lines in a global data bus.

In accordance with an aspect of the present invention, there is provided a semiconductor memory device having a bank for storing a data and a port as a data I/O terminal includes a transmitter for delivering the data inputted from the port; a global data bus for flowing an appearing current corresponding to the data outputted from the transmitter; and a receiver for sensing the appearing current by using a current-mirror and delivering the data corresponding to the sensed appearing current into the bank, wherein a swing range of a data bus voltage in response to the appearing current is narrower than a gap between a supply voltage and a ground.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device for minimizing a current consumption according to increasing the number of bus lines in a global data bus in accordance with the present invention will be described in detail referring to the accompanying drawings.

Figure 3:
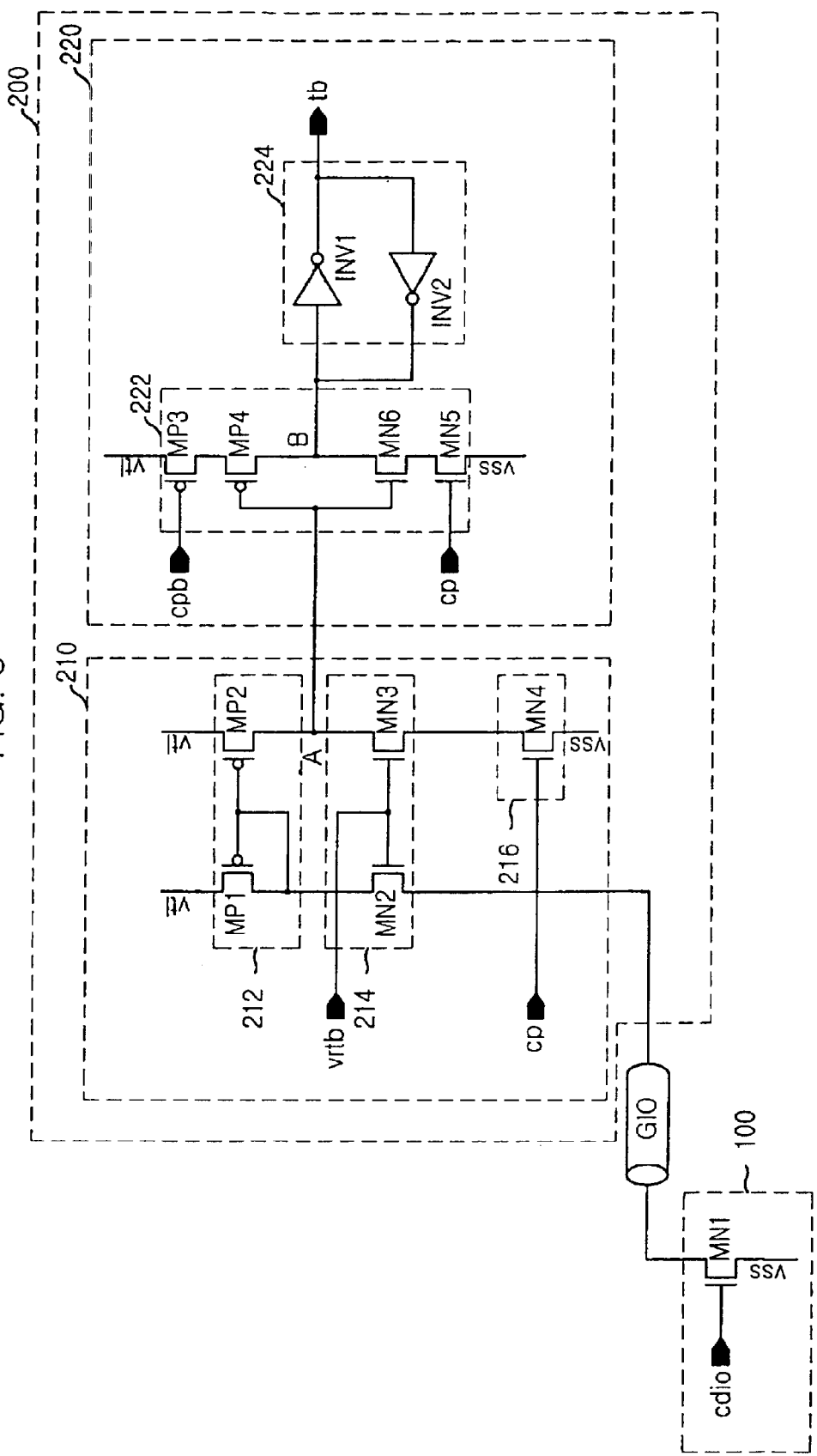
FIG. 3 is a schematic diagram describing a transmitter and a receiver in accordance with the present invention.

FIG. 3 is a schematic diagram describing a transmitter and a receiver of each transceiver included in the semiconductor memory device in accordance with the present invention.

As shown, there are a transmitter 100, a receiver 200 having a current mirror block 210 and a latch block 220. Herein, the transmitter 100 coupled between a port and a global data bus GIO is for delivering a data inputted from the port to the global data bus GIO. Also, for delivering the data loaded in the global data bus GIO to a bank, the receiver 200 are coupled between the global data bus GIO and the bank.

Figure 1:
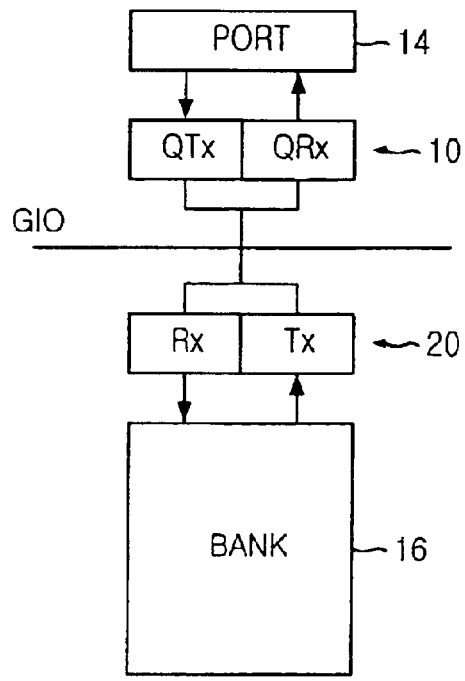
FIG. 1 is a block diagram showing a data path of a conventional semiconductor memory device.
Figure 2:
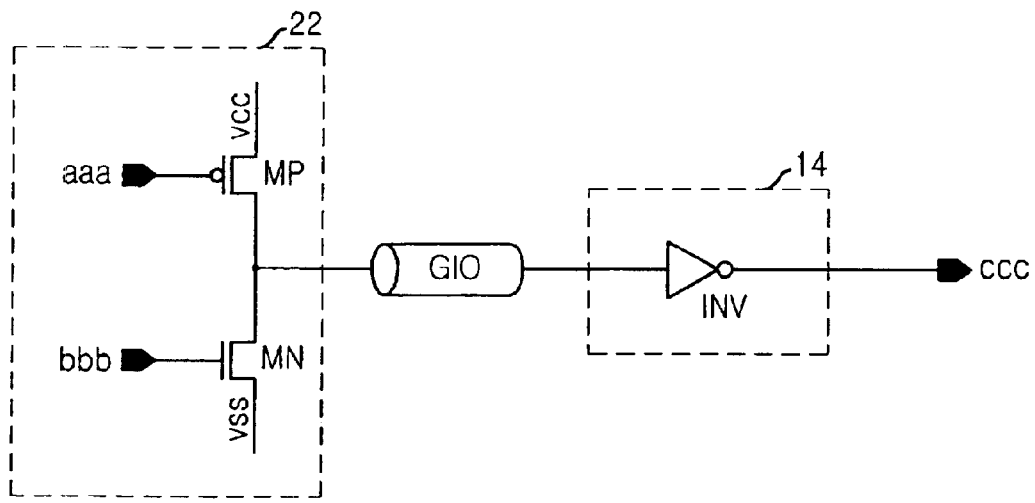
FIG. 2 is a schematic diagram describing a transmitter and a receiver shown in FIG. 1.

Furthermore, referring to FIG. 1, the transmitter 100 has the function in response to a first transmitter QTx of a first transceiver 10; and the receiver 210 having the current mirror block 210 and the latch block 220 has the function in response to a second receiver RX of a second transceiver 20.

The transmitter 100 includes a first NMOS transistor MN1. A gate of the NMOS transistor MN1 receives a data signal cdio, a drain of the NMOS transistor is connected to a ground and a source of the NMOS transistor is coupled to the global data bus GIO. Herein, the first NMOS transistor MN1 serves as a pull-down driver.

In the receiver 200, the current mirror block 210 includes a current mirror 212 for mirroring an appearing current of the global data bus GIO; a current control block 214 coupled between the current mirror 212 and the global data bus GIO for controlling amount of the appearing current; and a switching block 216 coupled to the current control block 214 for enabling the output of the current mirror in response to a data control signal cp. Herein, the current control block 214 is controlled by a reference voltage vrtb.

Herein, the current mirror 212 include a first PMOS transistor MP1 having a gate, a drain and a source, the gate and drain diode-connected, the source connected to a supply voltage vtl; and a second PMOS transistor MP2 having a gate, a drain and a source, the drain connected to an output node, the source connected to the supply voltage vtl, the gate connected to the gate of the first PMOS transistor MP1. Also, the current control block 214 include a second NMOS transistor MN2 having a gate, a drain and a source, the gate coupled to the reference voltage vrtb, the source connected to the drain of the first PMOS transistor MP1 and the drain connected to the global data bus GIO; and a third NMOS transistor MN3 having a gate, a drain and a source, the gate coupled to the reference voltage vrtb, the source connected to the drain of the second PMOS transistor MP2. In addition, the switching block 216 include a fourth NMOS transistor MN4 having a gate, a drain and a source, the gate coupled to the data control signal cp, the source connected to the drain of the second NMOS transistor MP2 and the drain connected to the ground VSS.

The latch block 220 include an inverting block 222 controlled by the data control signal cp and the inverse data control signal cpb for inverting the mirrored voltage outputted from the current mirror block 210; and a latch 224 having two loop-connected inverters INV1 and INV2 for latching the inverse mirrored voltage as the data to output the data into the bank.

In detail, the inverting block 222 includes a third PMOS transistor MP3 having a gate, a drain and a source, the gate coupled to the inverse data control signal cpb, the source connected to the supply voltage vtl; a fourth PMOS transistor MP4 having a gate, a drain and a source, the gate coupled to the mirrored voltage outputted from the current mirroring block 210, the source connected to the drain of the third PMOS transistor MP3, the drain coupled to the latch 224; a fifth NMOS transistor MN5 having a gate, a drain and a source, the gate coupled to the data control signal cp, the drain connected to the ground VSS; and a sixth NMOS transistor MN6 having a gate, a drain and a source, the gate coupled to the mirrored voltage outputted from the current mirroring block 222, the drain connected to the source of the fifth NMOS transistor MN5, the source coupled to the latch 224.

Briefly, the receiver 200 includes the current mirror block 210 for mirroring the appearing current of the global data bus GIO to output a mirrored voltage as the data; and the latch block 220 for inverting the mirrored voltage outputted from the current mirror block 210 and latching the converse mirrored voltage as the data to output the data into the bank.

As mentioned above, another transmitter and receiver, which are used for retrieving a data stored in the bank and delivering the data into the port, are same structure with the transmitter 100 and the receiver 200.

Herein, the reference voltage vrtb being a kind of direct voltage has a predetermined level based on a length of the global data bus GIO, an operation frequency and like this.

Figure 4:
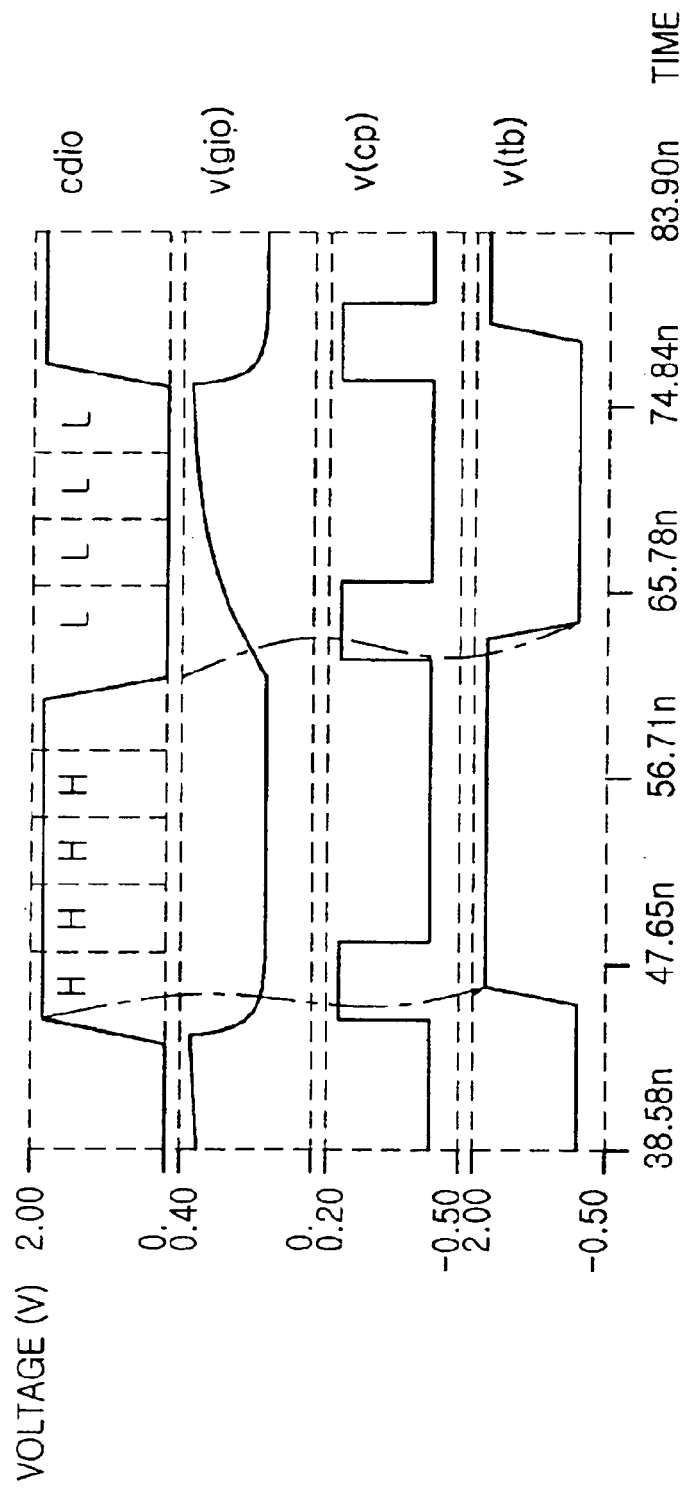
FIG. 4 is a waveform demonstrating a simulation result about a current consumption of the transmitter and the receiver shown in FIG. 3.

FIG. 4 is a waveform demonstrating a simulation result about a current consumption of the transmitter 100 and the receiver 200 shown in FIG. 3.

The data control signal cp is a kind of high active pulse having a predetermined active period, e.g. 1tCK (1 external clock cycle) when an instruction such as a write or read command is inputted.

Hereinafter, referring to FIGS. 3 and 4, an operation of the transmitter and the receiver included in the semiconductor memory device in accordance with the present invention is described in detail.

First, if the data signal cdio is a logic high level, the first NMOS transistor MN1 is turned on. Then, on the global data bus GIO, the appearing current flows. Namely, the appearing current is generated at a current path throughout the first PMOS transistor MP1, the second NMOS transistor MN2, the global data bus GIO and the first NMOS transistor MN1 between the source voltage vtl and the ground VSS. Herein, a voltage supplied on the global data bus in response to the appearing current is equal to or lower than vtl−Vtp, i.e. the value of subtracting the supply voltage vtl from a threshold voltage of the first PMOS transistor MP1. As a result, by the current mirror 212, the mirrored voltage of an output node A between the second PMOS transistor MP2 and the third NMOS transistor MN3 is a logic high level.

At that time, if the fourth NMOS transistor MN4 is turned on by the data control signal cp, the mirrored voltage of the output node A is unstable. Thus, the second PMOS transistor MP2 must be designed in a size for preventing that the mirrored voltage of the output node is rapidly decreased.

Then, if the data control signal cp is a logic high level, the third PMOS transistor MP3 and the fifth NMOS transistor MN5 are turned on. At this time, if the mirrored voltage being a logic high level, the sixth NMOS transistor MN6 is turned on and a first node B is a logic low level. Then, the latch 224 coupled to the first node B keeps outputting a logic high level until a voltage level of the first node B is changed after the data control signal cp is activated next time.

In the other case that the data signal cdio is inputted a logic low level, the first NMOS transistor MN1 in the transmitter 100 is turned off. As a result, the appearing current is not generated at the current path between the supply voltage vtl and the ground VSS. Thus, the first and second PMOS transistors in the current mirror 212 are turned off. At this time, if the fourth NMOS transistor MN4 is turned on by the data control signal cp, the mirrored voltage of the output node A goes down, i.e. a logic low level.

Then, if the data control signal cp is a logic high level, the third PMOS transistor MP3 and the fifth NMOS transistor MN5 are turned on. At this time, if the mirrored voltage being a logic low level, the fourth PMOS transistor MP4 is turned on and the first node B is a logic high level. Then, the latch 224 coupled to the first node B keeps outputting a logic low level until the voltage level of the first node B is changed after the data control signal cp is activated next time.

In the receiver 200, level of the supply voltage is about 1.8 V. Thus, if the data signal cdio is a logic high level, voltage level of the global data bus GIO is slightly higher than 0 V; and, otherwise, the voltage level of the global data bus GIO is under about 1 V because of the threshold voltage of MOS transistor. Namely, in the present invention, a swing range of voltage level supplied to the global data bus GIO is narrow, i.e. about 1 V. In contrast, in the prior art, if a swing range of the data signal is from about 0 V to about 2 V, e.g. cdio as shown in FIG. 4, the swing range of the voltage level supplied to the global data bus GIO is wide, i.e. about 2 V. Thus, the semiconductor memory device in accordance with the present invention can minimize a current consumption at the global data bus GIO because the swing range of the voltage level supplied to the global data bus GIO is much narrow. As a result, although the global data bus GIO has a plurality of bus line over 128 lines, e.g. 256 lines or 512 lines, the current consumption of the global data bus GIO in the semiconductor memory device is satisfactory.

In the other hand, for reducing the current consumption, the transmitter 100 can consist of a pull-up driver, e.g. one PMOS transistor, not the pull-down driver, e.g. the first NMOS transistor MN1 as shown in FIG. 3. However, in this case that the transmitter 100 consists of the pull-up driver, a size of the pull-up driver should be larger twice than that of the pull-down driver. Thus, the pull-up driver is not proper choice for the transmitter in the semiconductor memory device.

Moreover, referring to FIG. 1, each of the transmitter 100 and the receiver 200 described in FIG. 3 can be also applied to each of a second transmitter Tx of the second transceiver 20, which is coupled to the bank, and a first receiver QRx of the first transmitter 10, which is coupled to the port.

As described above, the semiconductor memory device in accordance with the present invention has an effect with minimizing current amount flowing on the global data bus. As a result, the global data bus in the semiconductor memory device has a plurality of bus lines, e.g. 128, 256 and 512, more than the conventional semiconductor memory device has.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device having a bank for storing a data and a port as a data I/O terminal, comprising:
   a transmitter for delivering the data inputted from the port;
   a global data bus for flowing an appearing current corresponding to the data outputted from the transmitter; and
   a receiver for sensing the appearing current by using a current-mirror and delivering the data corresponding to the sensed appearing current into the bank,
   wherein the receiver includes a current mirror block for mirroring appearing current of the global data bus to output a mirrored voltage as the data; and a latch block for inverting the mirrored voltage outputted from the current mirror block and latching the converse mirrored voltage as the data to output the data into the port.

2. The semiconductor memory device as recited in claim 1, wherein a supply voltage is supplied to the current mirror.

3. The semiconductor memory device as recited in claim 2, wherein
   a swing range of a data bus voltage in response to the appearing current is narrower than a gap between the supply voltage and a ground.

4. The semiconductor memory device as recited in claim 3, wherein the latch block includes:
   an inverting block controlled by a data enable signal for inverting the mirrored voltage outputted from the current mirror block; and
   a latch having two loop-connected inverters for latching the inverse mirrored voltage as the data to output the data into the port.

5. The semiconductor memory device as recited in claim 3, wherein the current mirror block includes:
   a current mirror for mirroring the appearing current of the global data bus;
   a current control block coupled between the current mirror and the global data bus for controlling amount of the appearing current; and
   a switching block coupled to the current control block for enabling the output of the current mirror in response to a data control signal.

6. The semiconductor memory device as recited in claim 5, wherein the current mirror includes:
   a first PMOS transistor having a gate, a drain and a source, the gate and drain diode-connected, the source connected to a supply voltage; and
   a second PMOS transistor having a gate, a drain and a source, the drain connected to an output node, the source connected to a supply voltage, the gate connected to the gate of the first PMOS transistor.

7. The semiconductor memory device as recited in claim 6, wherein the current control block includes:
   a first NMOS transistor having a gate, a drain and a source, the gate coupled to a reference voltage, the source connected to the drain of the first PMOS transistor and the drain connected to the global data bus; and
   a second NMOS transistor having a gate, a drain and a source, the gate coupled to the reference voltage, the source connected to the drain of the second PMOS transistor.

8. The semiconductor memory device as recited in claim 7, wherein the switching block includes
   a third NMOS transistor having a gate, a drain and a source, the gate coupled to a data enable signal, the source connected to the drain of the second NMOS transistor and the drain connected to a ground.

9. The semiconductor memory device as recited in claim 4, wherein the inverting block includes:
   a first PMOS transistor having a gate, a drain and a source, the gate coupled to the inverse data enable signal, the source connected to the supply voltage;

a second PMOS transistor having a gate, a drain and a source, the gate coupled to the first or second data outputted from the mirroring block, the source connected to the drain of the first PMOS transistor, the drain coupled to the latch;

a first NMOS transistor having a gate, a drain and a source, the gate coupled to the data enable signal, the drain connected to a ground; and a second NMOS transistor having a gate, a drain and a source, the gate coupled to the first or second data outputted from the mirroring block, the drain connected to the source of the first NMOS transistor, the source coupled to the latch.

10. The semiconductor memory device as recited in claim 1, wherein the transmitter includes a NMOS transistor, coupled between the global data bus and a ground, having a gate coupled to the data.

* * * * *